(12) United States Patent
Yamasaki et al.

(10) Patent No.: US 6,828,667 B2
(45) Date of Patent: Dec. 7, 2004

(54) SURFACE MOUNTING TYPE ELECTRONIC COMPONENT

(75) Inventors: Masato Yamasaki, Okayama (JP); Koji Ono, Okayama (JP); Takumi Nishimoto, Okayama (JP); Jun Sato, Okayama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/297,786

(22) PCT Filed: Apr. 5, 2002

(86) PCT No.: PCT/JP02/03464

§ 371 (c)(1),
(2), (4) Date: Jul. 29, 2003

(87) PCT Pub. No.: WO02/085082

PCT Pub. Date: Oct. 24, 2002

(65) Prior Publication Data

US 2004/0016567 A1 Jan. 29, 2004

(51) Int. Cl.$^7$ .............................................. H01L 23/48
(52) U.S. Cl. .................. 257/693; 257/690; 257/692; 257/694; 257/696; 257/735; 361/807; 361/810; 361/811
(58) Field of Search .................. 257/690, 692–696, 257/735; 361/807–811, 760, 761, 764, 772, 773, 774, 791

(56) References Cited

U.S. PATENT DOCUMENTS 4,951,124 A * 8/1990 Sawaya ....................... 257/692
5,446,623 A * 8/1995 Kanetake ..................... 361/760
5,889,658 A * 3/1999 Sullivan et al. ............. 361/773
6,456,505 B1 * 9/2002 Suzuki et al. ................ 361/803

FOREIGN PATENT DOCUMENTS

| JP | 49-33385 | 3/1974 |
|----|----------|--------|
| JP | 50-26735 | 9/1975 |
| JP | 55-166995 | 12/1980 |
| JP | 02 241084 | 9/1990 |
| JP | 04-049646 | 2/1992 |
| JP | 09 035784 | 2/1997 |
| JP | 09 326269 | 12/1997 |

OTHER PUBLICATIONS

European Search Report corresponding to application No. EP 02 71 4512 dated Jul. 21, 2004.

* cited by examiner

*Primary Examiner*—David A. Zarneke
*Assistant Examiner*—Thanh Y. Tran
(74) *Attorney, Agent, or Firm*—RatnerPrestia (57) ABSTRACT

A surface mounted electronic component includes a case and a board mounting part. The board mounting part includes a leg bent in parallel with a printed circuit board at its tip, an outer frame soldered to a land of a mounted part on the board, and a projection disposed in the outer frame and inserted into a hole in the mounted part. The electronic component is mounted on a surface of the printed circuit board in various electronic instruments, and can keep to be mounted on the board tightly even when an external force is applied.

14 Claims, 7 Drawing Sheets

SURFACE MOUNTING TYPE ELECTRONIC COMPONENT

THIS APPLICATION IS A U.S. NATIONAL PHASE APPLICATION OF PCT INTERNATIONAL APPLICATION PCT/JP02/03464.

FIELD OF THE INVENTION

The present invention relates to a surface mounted electronic component mounted on a surface of a printed circuit board in various electronic instruments and having a function, such as an encoder, a variable resistor, or a switch.

BACKGROUND OF THE INVENTION

Electronic instruments have recently been downsized and thinned, and this requires downsizing and thinning of electronic components used for them strongly. A surface mounted electronic component (it is called electronic component hereinafter) has been preferably used.

The electronic component is mainly a chip type electronic component, but is an electronic component having a function, such as an encoder, a variable resistor, or a switch, which is utilized with an operation knob mounted to an operating shaft.

The electronic component has an output terminal out of a case and a board mounting part, such as a leg, mounted to the case. The board mounting part is soldered to a land of a component-soldered part on the printed circuit board, thereby assuring mounting strength of the electronic component.

A material used for the board mounting part of the electronic component is thinned or narrowed, thereby downsizing and thinning the electronic component and reducing its material.

Figure 8:
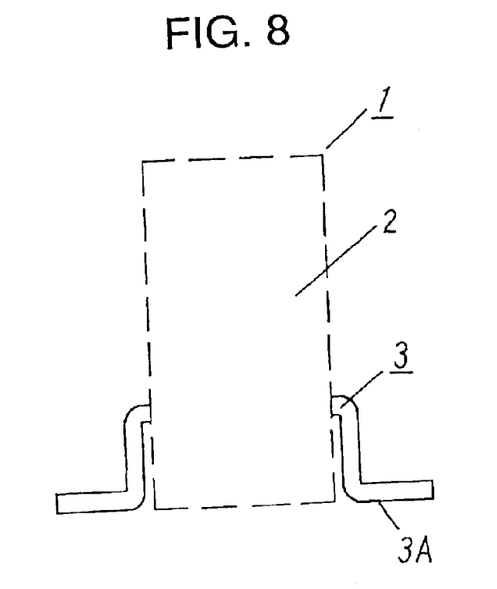
FIG. 8 is a front view of a conventional surface mounted electronic component.
Figure 9:
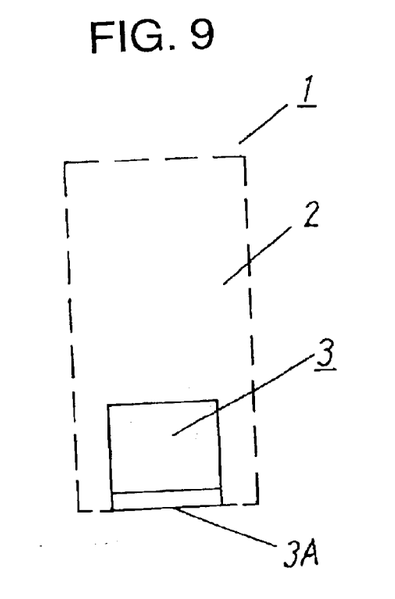
FIG. 9 is a side view of the conventional surface mounted electronic component.
Figure 10:
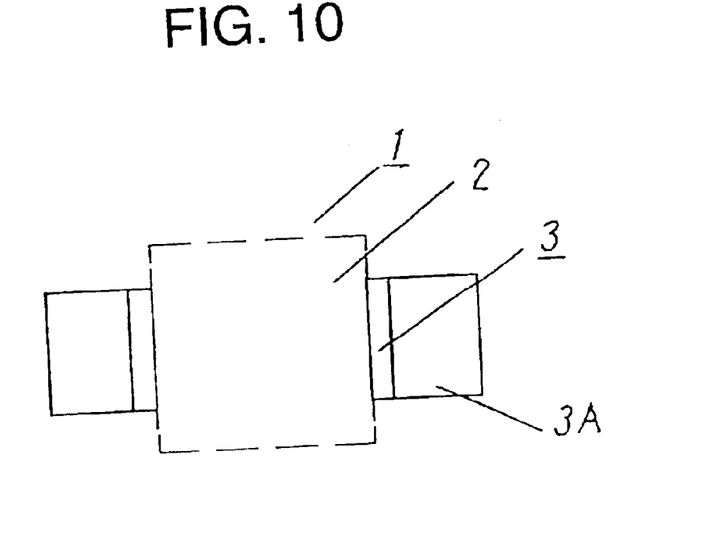
FIG. 10 is a top view of the conventional surface mounted electronic component.

Such a conventional surface mounted electronic component having a board mounting part will be described hereinafter with reference to the accompanying drawings. FIG. 8 is a front view of the conventional surface mounted electronic component. FIG. 9 is a side view of the component. FIG. 10 is a top view of the component. The surface mounted electronic component 1 includes a resin case 2 and a leg 3 as the board mounting part.

The leg 3 made of metallic flat plate projects outward from a side of the case 2, is bent toward the bottom side of the case 2 at a predetermined position, and extends along a side wall of the case 2. The leg 3 has a soldering part 3A projecting outward from a bottom surface position of the case 2. The soldering part 3A is bent near the case 2 laterally by approximately 90°. The leg 3 is disposed on each sides of the case 2 opposite to each other of the electronic component 1.

The case 2 accommodates a functioning component, such as an encoder, a variable resistor, or a switch, and the output terminal is guided out of the case 2 (not shown).

Figure 11:
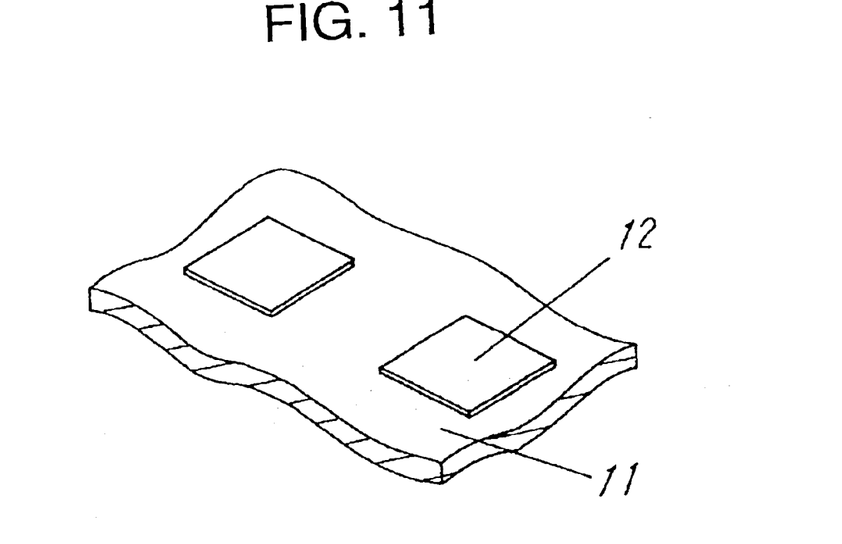
FIG. 11 is a perspective view of a printed board for receiving the conventional surface mounted electronic component.

A printed circuit board 11 for accepting the electronic component 1 has two lands 12 soldered to the soldering parts 3A of the legs 3, as shown in a perspective view of FIG. 11.

Figure 12:
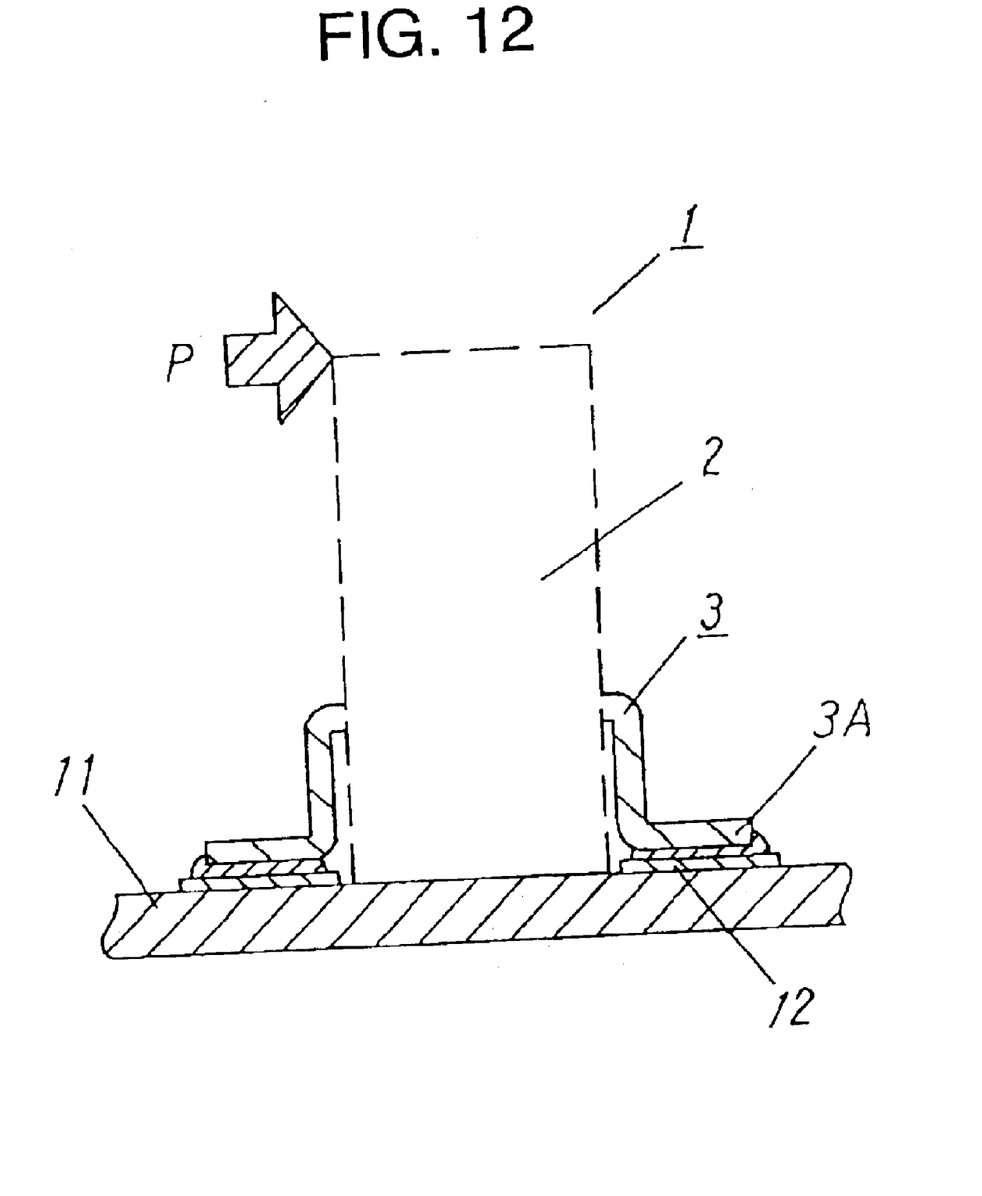
FIG. 12 shows the printed circuit board including the conventional surface mounted electronic component mounted thereon.

The electronic component 1 is mounted through having the output terminals (not shown) soldered to a predetermined pattern (not shown) on the printed circuit board 11 and through having the soldering parts 3A as the board mounting parts soldered to the lands 12 on the board 11. While being mounted, even if an external force P is applied to the side of the electronic component 1, the electronic component 1 absorbs the external force P with connection between the board mounting parts (the legs 3) and the board 11.

If the conventional surface mounted electronic component 1 having the legs 3 as the board mounting part is downsized and thinned, the leg 3 must be narrowed, shortened, and thinned. This structure accordingly reduces the soldering strength of the soldering part 3A to the board 11 and the strength of the leg 3 itself, so that shortage of the strength against the external force P is concerned.

SUMMARY OF THE INVENTION

A surface mounted electronic component includes a case, a leg extending from the case, and a board mounting part at a tip of the leg. The leg includes a projection extending in an extending direction of the leg from the case, and an outer frame formed perpendicularly to the projection away from the case.

The surface mounted electronic component keeps to be mounted tightly to a circuit board even when an external force is applied to the electronic component.

DETAILED DESCRIPTION OF THE PREFERRED EMBODIMENT

Figure 1:
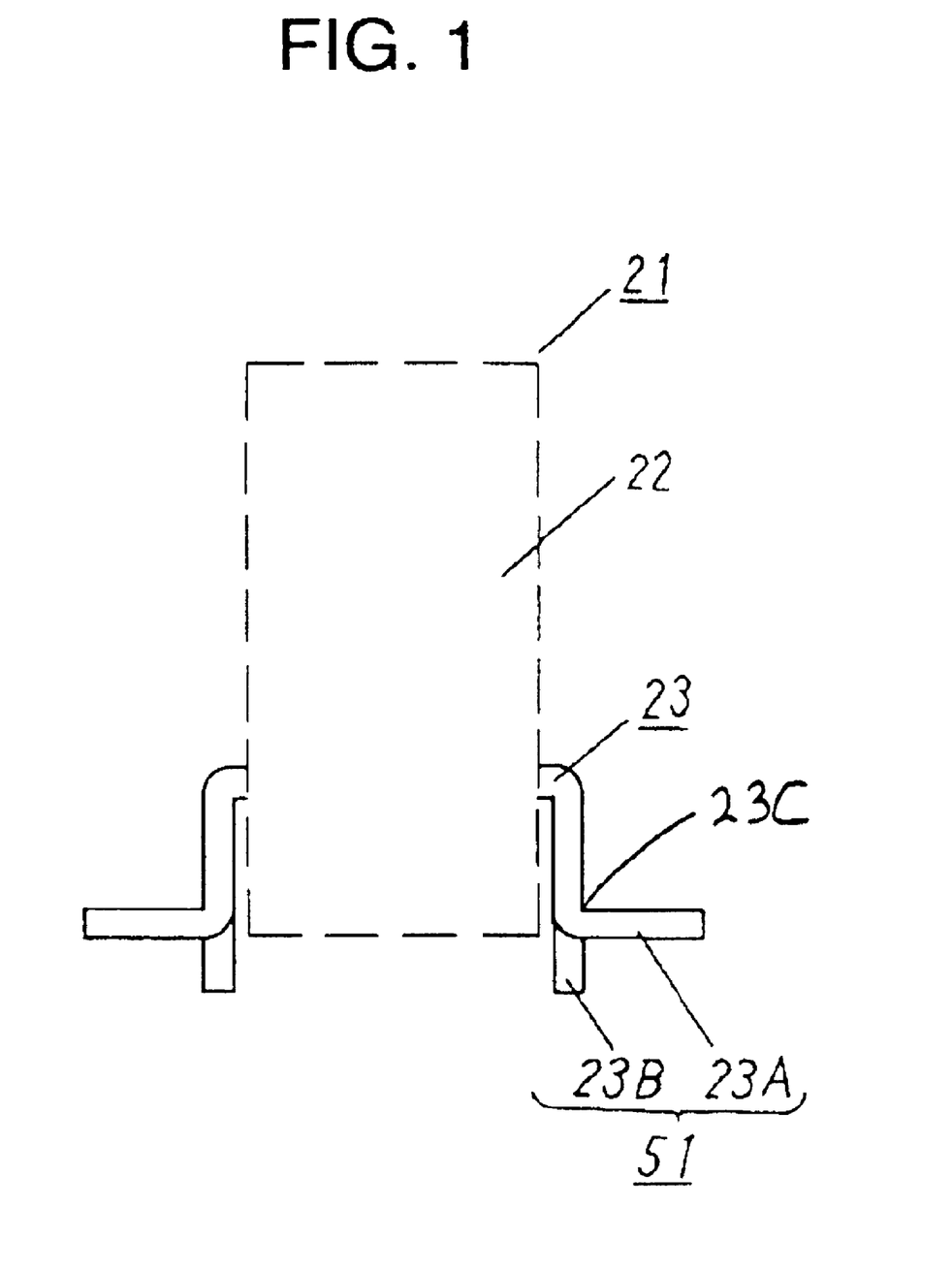
FIG. 1 is a front view of a surface mounted electronic component in accordance with an exemplary embodiment of the present invention.
Figure 2:
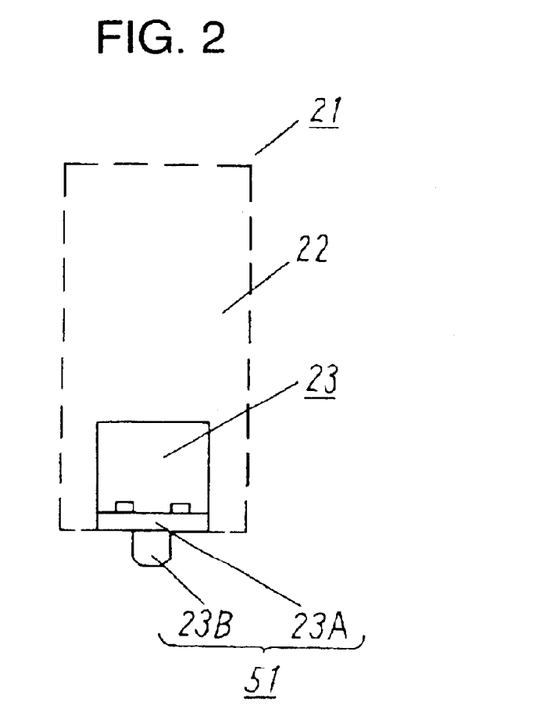
FIG. 2 is a side view of the surface mounted electronic component in accordance with the embodiment.
Figure 3:
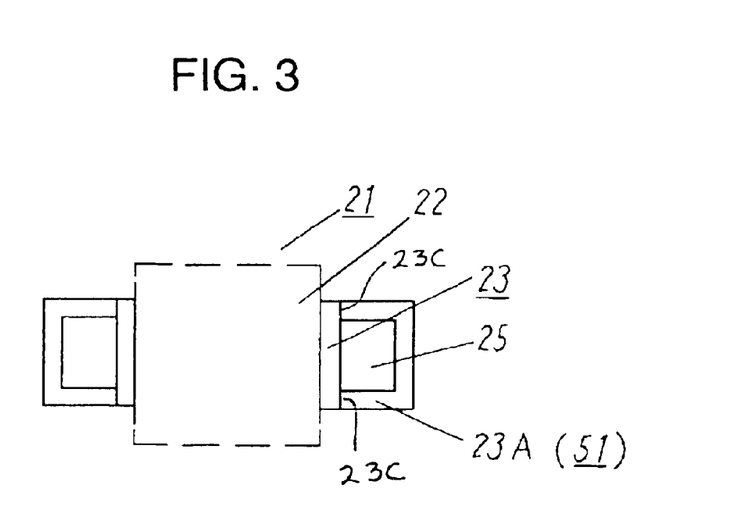
FIG. 3 is a top view of the surface mounted electronic component in accordance with the embodiment.

FIG. 1 is a front view of a surface mounted electronic component in accordance with an exemplary embodiment of the present invention. FIG. 2 is a side view of the component, and FIG. 3 is a top view of the component. A surface mounted electronic component 21 includes a resin case 22 substantially square in its top view and fixtures made of metal plate fixed to the case 22. A tip of the leg 23 of each fixture extends downward along a side surface of the case 22 functions as a board mounting part 51.

The leg 23 may extend integrally on the side surface of a fixture mounted as to cover the case 22.

Detailed configurations of a fixing part between the case 22 and the fixture, an operating shaft projecting upward from the case 22, and the like are complicated, and thus, these are considered integrally as the case 22 in the drawings for simple explanation.

The tip of the leg 23 includes an outer frame 23A having the same width as that of the leg 23. The outer frame 23A is bent outward by approximately 90° from the leg 23 at a height equal to a bottom surface of the case 22. The outer frame 23A is perpendicular to the leg 23, as shown in FIG. 3. The outer frame 23A has a substantially square U-shaped tip having its opening towards the case 22. The tip of the outer frame 23A is integrally connected to the leg 23, and the integrated structure has a penetration hole 25 at a center from top view.

A central position of a portion of the leg 23 connected with the opening of the outer frame 23A is provided with a projection 23B. As shown in FIG. 2, the projection 23B projects under the bottom of the case 22, and is formed unitarily with the leg 23 in its extending direction.

The board mounting part 51 of the present embodiment includes the outer frame 23A and the projection 23B that are orthogonal to each other.

The board mounting parts 51 are disposed on facing edges of the four edges constituting the outer periphery of the case 22, respectively. The facing edges are different from the edges having an output terminal (not shown).

Figure 4:
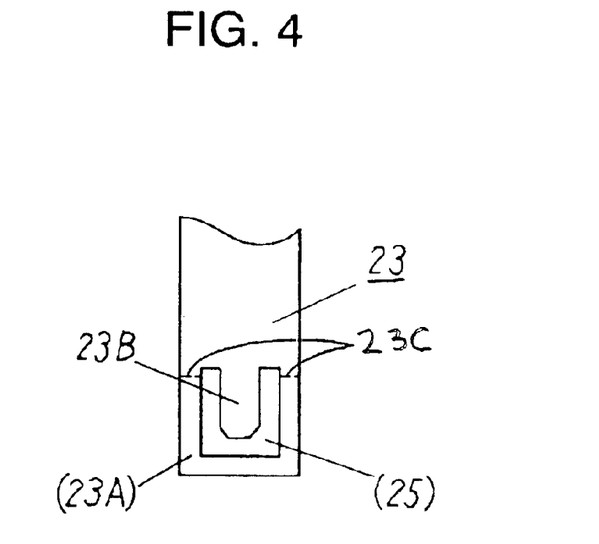
FIG. 4 is a side view for illustrating a method of forming a board mounting part of the surface mounted electronic component in accordance with the embodiment.

For forming the board mounting part 51, a tip of the leg 23 formed at a predetermined width, as shown in the side view in FIG. 4, is punched to form an upward square U-shaped opening. The opening corresponds to the through hole 25. The remaining part of the tip of the leg 23 is machined in a frame shape with the predetermined width. Then, the remaining part is bent perpendicularly at broken lines of FIG. 4 so as to separate the tip from the case 22 to form the outer frame 23A. The outer frame 23A has a frame shape, and thus, a deviation of the lateral bending position is small, thus allowing the frame to be bent easily and accurately. Therefore, the projection 23B from the leg 23 is consequently positioned accurately.

Thus, the board mounting part 51 is simply and accurately formed of a part coaxial with the leg 23 without material loss.

Figure 5:
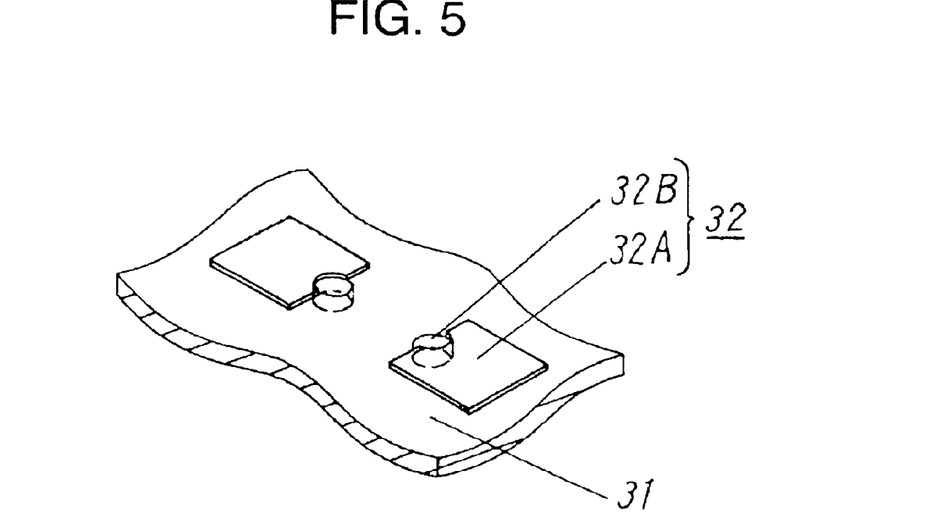
FIG. 5 is a perspective view of a printed circuit board for accepting the surface mounted electronic component in accordance with the embodiment.

A printed circuit board 31 for accepting the electronic component 21 including the board mounting parts 51 has a substantially quadrangular lands 32A at positions corresponding to the outer frames 23A of the legs 23, as shown in FIG. 5. The lands 32A are used as mounted parts 32 for the board mounting parts 51, and are larger than the outer frames 23A. A central part at an edge of each land 32A includes a hole 32B, where the projection 23B passes, disposed on the leg 23.

Since the electronic component 21 includes the board mounting parts 51 facing each other, the mounted parts 32 corresponding to them faces each other on the printed board 31 with the edges having the holes 32B as inner edges.

The board 31 includes a land corresponding to an output terminal and a pattern connected to the land (not shown).

Figure 6:
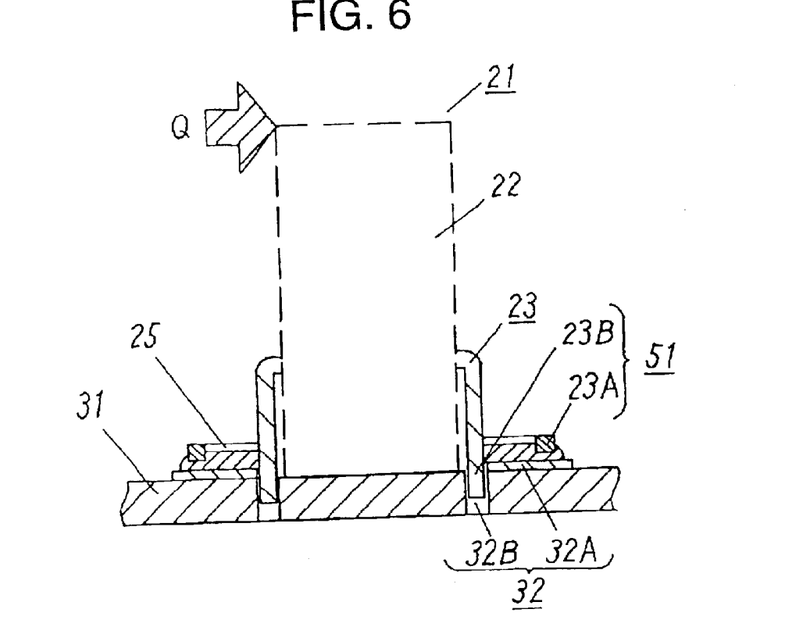
FIG. 6 shows the board including the surface mounted electronic component mounted thereon in accordance with the embodiment.

For mounting the electronic component 21 on the board 31, cream solder is applied to the land corresponding to the output terminal on the board 31, and cream solder is also applied to the lands 32A of the mounted parts 32, as shown in FIG. 6. The projections 23B are inserted into the holes 32B to mount the electronic component 21 on the board 31.

At this moment, entire lower surfaces of the outer frames 23A are securely butted on the lands 32A. That is because the outer frames 23A orthogonal to the projections 23B are parallel with an upper surface of the board 31, and the outer frames 23A themselves are bent accurately with little deviation of the lateral bending position, Then, the cream solder, upon being melted, connects the outer frames 23A to the land parts 32A of the mounted parts 32 and simultaneously, connects the output terminal to the land.

If a clearance between the projection 23B of each board mounting parts 51 and the hole 32B in the board 31 is small, the electronic component 21 is easily supported by itself even when the electronic component 21 is placed on the printed board 31. Additionally, a displacement of the electronic component 21 due to a movement in a manufacturing process until the soldering, and the vibration can be reduced. The clearance, if being such a size that the projection 23B is inserted into the hole 32B slightly press-fittingly, prevents the displacement and allows the electronic component 21 to be soldered accurately.

Since the entire lower surface of each outer frame 23A contacts with the cream solder, as discussed above, the inner end surface of the outer frame 23A including the penetration hole 25 as well as its outer end surface is certainly soldered, and is connected to the landts 32A on the board 31 at high connecting strength.

The electronic component 21 has the outer frames 23A thus tightly soldered to the lands 32A is soldered to the printed board 31. Therefore, even when an external force Q to tilt the electronic component 21 is applied to the electronic component 21 from a side direction or the like (FIG. 6), the projections 23B inserted into the holes 32B abut on side walls of the holes 32B to generate large resistance.

Additionally, the accurately formed outer frames 23A are certainly soldered to the lands 32A having the edges parallel with the side surface of the case 22, and the penetration holes 25 in the outer frames 23A are filled with the solder in soldering. This reinforces the legs 23 of the electronic component 21. Even when the external force Q is applied, the electronic component 21 can be kept to be mounted normally for a long time. Even if fixtures forming the board mounting parts 51 is thin, for example, the electronic component 21 is tightly mounted.

If the output terminal and the board mounting parts 51 are arranged so as to solder four edges on the outer periphery of the case 22, the board mounting parts 51 is tightly mounted regardless of the direction of the external force Q.

Figure 7:
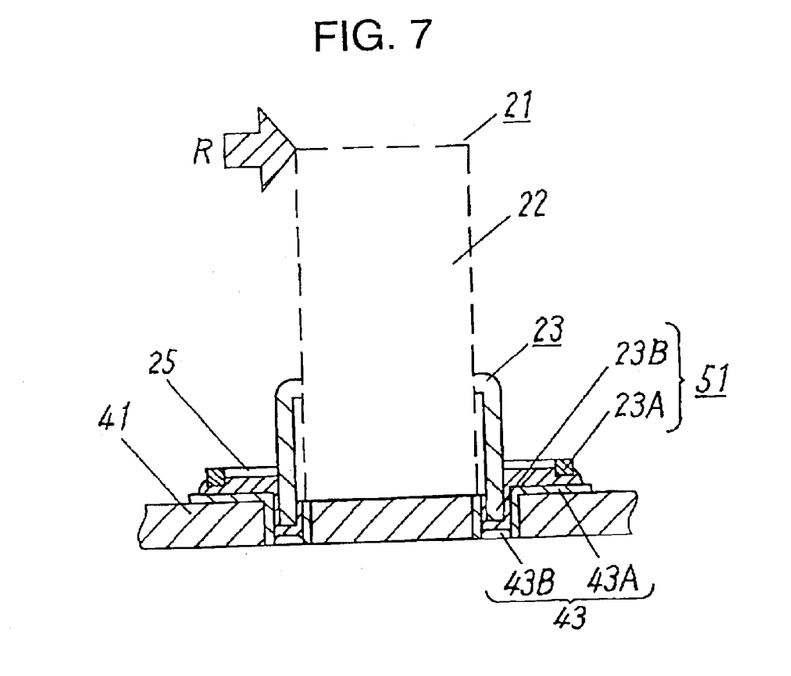
FIG. 7 shows another printed circuit board including the surface mounted electronic component mounted thereon in accordance with the embodiment.

The projections 23B of the board mounting parts 51 are inserted into the holes 32B in the board 31 in the above example. As shown in FIG. 7, a printed circuit board 41 including mounted parts 43 having side walls processed into solderable as a through hole 43B may be used. In this case, the output terminal of the electronic component 21 are soldered to the land, and the outer frames 23A are soldered to lands 43A of the mounted parts 43. The projections 23B are also soldered to the through holes 43B, where the projections pass. This allows the electronic component 21 to be more tightly soldered and mounted to the printed board 41. In other words, the side surfaces of the projections 23B are soldered and fixed to the side wall of the through holes 43B. This arrangement increases resistance to an undesired external force R transversely applied to the electronic component 21. Therefore, the electronic component 21 is kept to be mounted stably for a long time.

Even when solder is not previously applied to the side walls of the through holes 43B in the former case, cream solder may be pressed into the holes 32B using the projections 23B when the projections 23B is inserted into the holes 32B, thus allowing the component to be mounted similarly.

In either case, patterns (not shown) connected to the mounted parts 32 and 43 for the board mounting parts 51 of the printed boards 31 and 41 accepting the electronic component 21 may be connected to a ground in a working instrument. Static electricity from an operation part of the instrument into the electronic component 21 flows to the ground via the legs 23 (the board mounting parts 51) and the patterns connected to the board mounting parts 51 of the boards 31 and 41. This prevents noise caused by the static electricity, thereby allowing a predetermined functional element accommodated in the case 22 of the electronic component 21 to output normally, for example, an encoder, a variable resistor, or a switch.

The board mounting parts 51 may be formed of a member other than fixtures, and provides similar advantageousness.

INDUSTRIAL APPLICABILITY

According to the present invention, a surface mounted electronic component including a simplified board mounting part including an outer frame and a projection. The outer frame and the projection can be formed accurately without material loss.

What is claimed is:

1. A surface mounted electronic component comprising:
   a case;
   a leg extending from said case; and
   a board mounting part at a tip of said leg including:
      a projection extending from said case; and
      an outer frame extending perpendicularly to said projection and away from said case, said outer frame having a substantially U-shape, wherein said projection is surrounded with said outer frame and said case.

2. The surface mounted electronic component according to claim 1,
   wherein said projection is inserted into a hole formed in a circuit board, and
   wherein said outer frame is substantially parallel with said circuit board and is coupled to said circuit board.

3. The surface mounted electronic component according to claim 2,
   wherein said circuit board includes a solderable part formed on a side wall of said hole, and
   wherein said inserted projection is soldered to said solderable part of said hole.

4. The surface mounted electronic component according to claim 2, wherein said circuit board includes a mounted part coupled to a ground, said mounting part of said board being soldered to said outer frame.

5. The surface mounted electronic component according to claim 1, wherein said projection extends in an extending direction of said leg.

6. The surface mounted electronic component according to claim 1, wherein said substantially U-shape has tips, and said projection is located between said tips of said substantially U-shape.

7. The surface mounted electronic component according to claim 1, wherein said projection and said outer frame are integral to each other.

8. A surface mounted electronic component comprising:
   a case;
   a leg extending from said case; and
   a board mounting part at a tip of said leg including:
      a projection extending from said case; and
      an outer frame extending perpendicularly to said projection and away from said case, said outer frame having a substantially U-shape, wherein said substantially U-shape has tips, and said projection is located between said tips of said substantially U-shape.

9. The surface mounted electronic component according to claim 8, wherein said projection is surrounded with said outer frame and said case.

10. The surface mounted electronic component according to claim 8,
    wherein said projection is inserted into a hole formed in a circuit board, and
    wherein said outer frame is substantially parallel with said circuit board and is coupled to said circuit board.

11. The surface mounted electronic component according to claim 10,
    wherein said circuit board includes a solderable part formed on a side wall of said hole, and
    wherein said inserted projection is soldered to said solderable part of said hole.

12. The surface mounted electronic component according to claim 10, wherein said circuit board includes a mounted part coupled to a ground, said mounting part of said board being soldered to said outer frame.

13. The surface mounted electronic component according to claim 8, wherein said projection extends in an extending direction of said leg.

14. The surface mounted electronic component according to claim 8, wherein said projection and said outer frame are integral to each other.

* * * * *